United States Patent
Khor et al.

(10) Patent No.: US 6,953,711 B2
(45) Date of Patent: Oct. 11, 2005

(54) FLIP CHIP ON LEAD FRAME

(75) Inventors: Lily Khor, Kedah (MY); Au Keng Yeun, Perak (MY)

(73) Assignee: Carsem (M) Sdn. Bhd. (MY)

( * ) Notice: Subject to any disclaimer, the term of this patent is extended or adjusted under 35 U.S.C. 154(b) by 61 days.

(21) Appl. No.: 10/638,973

(22) Filed: Aug. 11, 2003

(65) Prior Publication Data

US 2005/0037545 A1 Feb. 17, 2005

(51) Int. Cl.$^7$ .......................... H01L 21/44; H01L 21/50
(52) U.S. Cl. ...................................... 438/123; 438/108
(58) Field of Search ................................ 438/106, 107, 438/108, 110, 111, 112, 121, 123, 124, 127

(56) References Cited

U.S. PATENT DOCUMENTS

| | | | | |
|---|---|---|---|---|
| 5,817,540 A | * | 10/1998 | Wark | ........................... 438/107 |
| 6,482,680 B1 | * | 11/2002 | Khor et al. | .................. 438/123 |
| 6,648,213 B1 | * | 11/2003 | Patterson et al. | ........... 228/223 |
| 6,661,087 B2 | * | 12/2003 | Wu | ............................. 257/692 |
| 6,700,187 B2 | | 3/2004 | Paek | |
| 6,717,068 B2 | * | 4/2004 | Motonishi et al. | .......... 174/261 |
| 6,846,704 B2 | | 1/2005 | Paek | |

* cited by examiner

*Primary Examiner*—Ha Nguyen
*Assistant Examiner*—Scott Geyer
(74) *Attorney, Agent, or Firm*—Townsend and Townsend and Crew LLP

(57) ABSTRACT

There is disclosed a flip-chip-type method of assembling semiconductor devices. A one-step encapsulation process promotes adhesion of the die to the lead fingers and prevents the potential of shorts developing between the adjacent bumps or lead fingers. Conventional mold compound is used to reduce localized stress caused by coefficient of thermal expansion (CTE) mismatch between the die and substrate, or the lead frame.

22 Claims, 1 Drawing Sheet

FLIP CHIP ON LEAD FRAME

TECHNICAL FIELD OF THE INVENTION

The present invention relates generally to a method of attaching a semiconductor die to lead frame, and more particularly to a flip-chip on lead frame method of attaching semiconductor die to the lead frame. This is an improvement over previously filed patent application PI 20001935 by the same applicant and inventors.

BACKGROUND OF THE INVENTION

The demands of product complexity keep increasing at an astounding rate, and there is a pressing need in the industry to increase the semiconductor die size in order to add in more functionality to provide such complex products. Yet, at the same time there is also a more pressing need in the industry to reduce the overall package size, especially due to miniaturization. In the past, this pressing issue has been somewhat satisfactorily resolved by utilizing the Ball Grid Array method (BGA) as a packaging solution to solve such problem. However, such BGA method is not a cost-effective solution for assembling a low pin count lead frame-based product such as the Shrink Small Outline Package (SSOP), Small Outline Transistor (SOT) or the like. This is mainly due to high substrate cost in comparison to standard lead frame cost. Consequently, many product designers have not seen a transition from the generally known practice to the flip-chip technology, especially for the low pin count devices, as an economically viable option.

The process flow for the flip-chip on BGA method generally involves flipping a bumped die onto a BGA substrate (normally organic or ceramic nature), underfilling, molding, ball attachment and singulation. As mentioned earlier, the relative cost of the substrate to the lead frame is higher, and therefore the transition of using such a technique to produce low pin count devices is not particularly acceptable or popular.

Nevertheless, there is disclosed a method of fabricating flip-chip on leads devices, as in U.S. Pat. No. 5,817,540, to assembled low pin count semiconductor devices. Generally, such method is said to have provided a large and robust flip-chip type interconnections between the electric contact points and the lead frame, eliminating the need for wire bonding and for adhesive connections of the lead frame to the die active surface. The disclosed method generally comprises flipping a die onto a lead frame with the use of bumps as interconnect. The wafer will be bumped and sawed beforehand. The bumping method will be as per what is used for the current flip-chip technology. Upon separating the dies, the bumped die will be flipped directly onto the matching lead frame. Connection between the die and the lead frame is achieved through re-flowing of the solder. When solder bumps are not used as an interconnection, conductive paste or conductive-filled epoxy may also be used. In such a case, conductive paste will be deposited onto the die by silk screening or any other method known in the art. Connection will then be achieved through the curing of paste in an oven or in-line furnace, as generally known in the art. The die placement accuracy needed is ±2 mils (5.08 micrometers). After the die-to-lead frame assembly, a dielectric layer, or the under-fill material, will be dispensed to cover the gap existing between the die and the lead frame, primarily for preventing potential shorting and to further promote adhesion between the die and the lead frame. Final encapsulation is accomplished using the conventional overmold process known in the art. This method, in particular, is suitable to assemble DRAM devices.

Although the disclosed U.S. Pat. No. 5,817,540 method offers certain advantages, it also permits potential shorting to develop between the adjacent solder bumps or lead fingers. In particular, this is due to the direct re-flow of the solder bumps onto the lead frame, which causes the solder to collapse completely onto the lead frame thus giving very little or no gap between the die and the lead frame. Consequently, shorting may develop between adjacent bumps or the lead fingers in addition to the uneven under-fill or mold compound coverage. Furthermore, the difficulty to ensure a consistent gap between the die and lead frame is also prevalent using this method.

The present invention seeks to provide an alternative solution to the known flip-chip on lead frame method of assembling semiconductor devices. A one-step encapsulation process promotes adhesion of die to the lead fingers and prevents the potential of shorts from developing between the adjacent bumps or lead fingers. Such advantageous features may be achieved through the use of conventional mold equipment and mold compound. Generally, mold compound is used for the same purpose as under-fill in any of the flip-chip construction to reduce localized stress caused by coefficient of thermal expansion (CTE) mismatch between the die and substrate, or the lead frame. This is particularly important in promoting greater mechanical robustness of the semiconductor devices. With one encapsulation step proposed by the present invention, the manufacturing process is made simpler, faster and relatively cheaper.

SUMMARY OF THE INVENTION

It is therefore an object of the present invention to provide a method of attaching a semiconductor die to a lead frame suitable for producing low pin count semiconductor devices.

It is another object of the present invention to provide a flip-chip-type method of attaching semiconductor die to a lead frame.

It is another object of the present invention to provide a single encapsulation step of packaging semiconductor devices, yet offering a substantially reduced localized stress caused by the coefficient thermal expansion mismatch.

It is another object of the present invention to provide a method of attaching a semiconductor die to a lead frame that is able to accommodate larger die size in a comparatively smaller packaging dimension.

These and other objects of the present invention are accomplished by providing,

A flip-chip-type method of attaching a semiconductor die to a lead frame, comprising the steps of:
  configuring the semiconductor die with a plurality of predetermined electric contact points so as to accommodate connection to lead fingers of the lead frame;
  configuring discrete conductive elements over the predetermined electric contact points; and
  securing the semiconductor die to the lead frame by re-flowing the discrete conductive elements.

Preferably, the semiconductor device is encapsulated using mold compound in a single encapsulation process.

Also preferable, the method may also be adapted to assemble higher pin count semiconductor devices.

Also preferable, the solder element layers are set to melt at substantially lower temperature compared to the discrete conductive elements.

The solder element is deposited onto the lead finger through stencil printing or any other suitable methods.

It is also preferable that the solder element is deposited onto the lead fingers through selective plating.

BRIEF DESCRIPTION OF THE DRAWINGS

The embodiments of the invention will now be described, by way of example only, with reference to the accompanying figures in which.

DETAILED DESCRIPTION OF THE DRAWINGS

Figure 1:
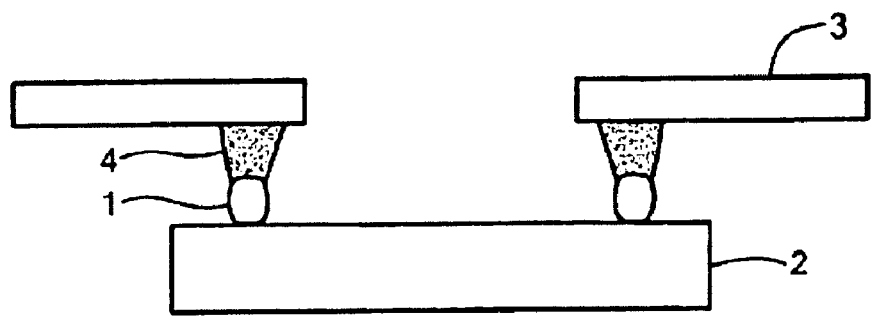
FIG. 1 shows a cross-sectional view of a prior art semiconductor assembly.

Referring now to FIG. 1, there is shown a cross-sectional view of the prior art semiconductor assembly, as generally disclosed in PI 20001935. In summary, the method offered the concept of flipping a die onto a lead frame with use of bumps (1) as interconnect, thus the term flip-chip. The semiconductor wafer will be bumped and sawed in the first place through a known method in the art. Upon separating the dies, the bumped die (2) will be flipped directly onto a matching lead frame (3). Connection between the die (2) and the lead frame (3) is achieved through re-flowing of the solder bump (1). To support the solder bumps (1), a conductive solder paste (4) is deposited onto the die (2) by silk screening or any other method known in the art. Connection will then be achieved through curing of the paste in an oven or in-line furnace. The die placement accuracy needed for this assembly is at ±2 mils (5.08 micrometers). After the die-to-lead frame assembly, a dielectric layer (not shown) which is also known as under-fill material, will be dispersed to cover the gap formed between the die (2) and the lead frame (3). This is to prevent potential shorting between the lead fingers and to further promote adhesion between the die (2) and the lead frame (3). Final encapsulation is then achieved through the conventional overmold method using mold compound (not shown) and equipment known in the art. As earlier discussed, such prior art method is not without its disadvantages.

Figure 2:
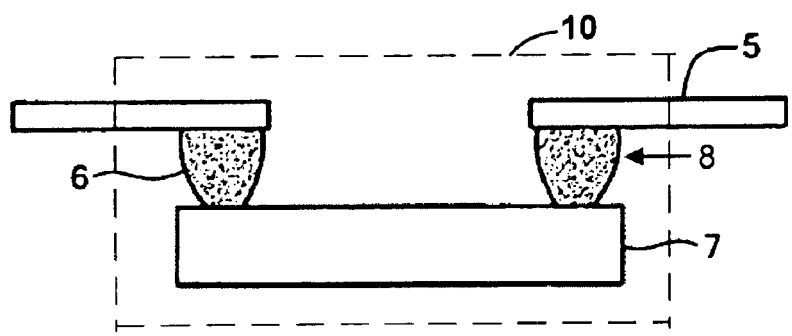
FIG. 2 shows a cross-sectional view of a semiconductor assembly according to the present invention.

Referring now to FIG. 2, there is shown semiconductor assembly constructed according to the method as proposed by the present invention. In general, the method provides a one step encapsulation process that is simpler, faster and cheaper compared to previous processes. Specifically, the method to assemble such semiconductor assembly is as the following steps.

Initially, the semiconductor wafer is bumped and sawed as known in the art. Such step also includes configuring a plurality of predetermined electric contact points on the semiconductor die. The electric contact points provide interconnection points that effect connection between the circuitry within the semiconductor to its lead frame (5). A discrete conductive element (6), or solder bump, is then formed over each of the predetermined electric contact points. The discrete conductive element (6) or the solder bumps formed on the semiconductor die are preferably made from a combination of alloy. Preferably, the discrete conductive element (6) is made from a composition of 90% Pb and 10% Sn; or 95% Pb and 5% Sn; with a melting range starting at around 300° C. This is desirable for controlling the standoff height between the die (7) and the lead frame (5), particularly to ensure that the mold compound 10 with its filler can flow in easily between the formed gap 8.

Unlike the previous practice where the solder element, preferably eutectic solder paste, is deposited onto the lead finger of the lead frame using a stencil printing process to form solder element layers, the above method does away with the solder element layer and stencils. This shortens the process significantly, and the resulting product is free from CTE problems. No-clean flux can be used to hold the die (7) in place before any connection is made to clean off any oxides on the plated surfaces. This is particularly due to the oxides which tend to inhibit the solder melting process later.

The discrete conductive element (6) is then re-flowed to secure the semiconductor die (7) to the lead frame (5). Die placement may be achieved using standard flip-chip border with ±1 mil (2.54 micrometers) accuracy. The height of the gap formed between the semiconductor die (7) and the lead frame (5) can advantageously be controlled. The gap height can be controlled by controlling the amount by which the discrete conductive elements (6) collapse, which in turn is controlled by controlling the melting time when re-flowing the discrete conductive elements (6). Instead of using underfill of dielectric layer to fill the gap, the present invention proposes a single encapsulation process where the gap is filled with encapsulation material. This can be achieved using conventional mold equipment and mold compound. Such mold compound is advantageously used to reduce localized stress due to CTE mismatch. As discussed earlier, the proposed invention offers a viable option to Ball Grid Array (BGA) process to assembled low pin count semiconductor devices that are mechanically robust and also offers more features per package in a miniaturized size.

The present invention is an improvement over previously filed patent application PI 20001935 by the same applicant and inventors. The above patent application achieved a bump to bump pitch of 12 mils mainly due to constraint in the current high volume stencil printing process capability. However, using the present method it is possible to achieve a bump to bump pitch of 8 mils. Also, in prior practice the lead finger width is at least 8 mils; however, using the present method the lead finger width is at least 4 mils, which is a 50% reduction.

While the preferred embodiments of the present invention have been described, it should be understood that various changes, adaptations and modifications may be made thereto.

It should be understood, therefore, that the invention is not limited to details of the illustrated invention shown in the figures and that variations in such minor details will be apparent to one skilled in the art.

What is claimed is:

1. A flip-chip-type method of attaching a semiconductor die to a lead frame, comprising the steps of:

configuring said semiconductor die with a plurality of predetermined electric contact points so as to accommodate connection to lead fingers of said lead frame;

configuring discrete conductive elements over the predetermined electric contact points; and securing said semiconductor die to said lead frame by reflowing said discrete conductive elements, wherein during the reflowing, an amount of collapse of the discrete conductive elements is controlled by controlling a melting time of the discrete conductive elements.

2. A method as claimed in claim 1, wherein during said reflowing, a solder wetting area is being limited by controlling the amount by which the discrete conductive elements collapse.

3. A method as claimed in claim 1, wherein a gap is formed between said secured semiconductor die and said lead frame.

4. A method as claimed in claim 3, wherein said gap is filled and encapsulated by an encapsulating material.

5. The method recited in claim 1 wherein the discrete conductive elements are made from a material that has a melting range starting at around 300° C.

6. The method recited in claim 1 wherein the discrete conductive elements are made from an alloy comprising lead and tin.

7. The method recited in claim 1 wherein the alloy consists essentially of lead and tin.

8. The method recited in claim 1 wherein the discrete conductive elements are made from an alloy comprising at least 90% lead.

9. The method recited in claim 1 wherein the discrete conductive elements collapsed during the securing step directly connect the semiconductor die to the lead frame without a solder element.

10. A method of attaching a semiconductor die to a lead frame, the method comprising:

providing a lead frame having a plurality of leads, each lead including first and second opposing surfaces;

providing a semiconductor die having opposed first and second surfaces and a plurality of bonding pads disposed on the first surface;

attaching a discrete conductive element to each bonding pad in the plurality of bonding pads;

positioning and aligning the semiconductor die so that the discrete conductive elements extend between the first surface of the semiconductor die and the first surface of respective ones of the plurality of leads; and reflowing the discrete conductive elements to securely connect the semiconductor die to the plurality of leads without using solder elements, wherein an amount of collapse of the discrete conductive elements is controlled by controlling a melting time of the discrete conductive elements.

11. The method recited in claim 10 wherein the discrete conductive elements are made from a material that has a melting range starting at around 300° C.

12. The method recited in claim 10 wherein the discrete conductive elements are made from an alloy comprising lead and tin.

13. The method recited in claim 12 wherein the alloy consists essentially of lead and tin.

14. The method recited in claim 10 wherein the discrete conductive elements are made from an alloy comprising at least 90% lead.

15. The method recited in claim 10 wherein the discrete conductive elements have a melting temperature that is substantially higher than that of solder elements.

16. The method recited in claim 10 further comprising applying flux to remove oxide from the first surface of the leads prior to reflowing the discrete conductive bumps.

17. A method for manufacturing an integrated circuit package, the method comprising:

providing a lead frame having a plurality of leads, each lead including first and second opposing surfaces;

providing a semiconductor die having opposed first and second surfaces and a plurality of bonding pads disposed on the first surface;

attaching a discrete conductive element to each bonding pad in the plurality of bonding pads;

positioning and aligning the semiconductor die so that the discrete conductive elements extend between the first surface of the semiconductor die and the first surface of respective ones of the plurality of leads;

reflowing the discrete conductive elements to securely connect the semiconductor die to the plurality of leads without using solder elements, wherein an amount of collapse of the discrete conductive elements is controlled by controlling a melting time of the discrete conductive elements; and applying encapsulant over the semiconductor die to form an integrated circuit package.

18. The method of manufacturing an integrated circuit package set forth in claim 17 wherein the discrete conductive elements are made from a material that has a melting range starting at around 300° C.

19. The method of manufacturing an integrated circuit package set forth in claim 17 further comprising applying flux to remove oxide from the first surface of the leads prior to reflowing the discrete conductive bumps.

20. The method of manufacturing an integrated circuit package set forth in claim 19 wherein the discrete conductive elements are made from an alloy comprising lead and tin.

21. The method of manufacturing an integrated circuit package set forth in claim 20 wherein the alloy consists essentially of lead and tin.

22. The method of manufacturing an integrated circuit package set forth in claim 21 wherein the discrete conductive elements are made from an alloy comprising at least 90% lead.

* * * * *